United States Patent [19]

Goronkin et al.

[11] Patent Number: 5,049,951

[45] Date of Patent: Sep. 17, 1991

[54] SUPERLATTICE FIELD EFFECT TRANSISTOR WITH MONOLAYER CONFINEMENT

[75] Inventors: Herbert Goronkin, Tempe; Saied N. Tehrani, Scottsdale; X. Theodore Zhu, Chandler, all of Ariz.

[73] Assignee: Motorola, Inc., Schaumburg, Ill.

[21] Appl. No.: 630,613

[22] Filed: Dec. 20, 1990

[51] Int. Cl.⁵ .................. H01L 27/12; H01L 29/161; H01L 29/80
[52] U.S. Cl. .......................................... 357/4; 357/16; 357/22
[58] Field of Search ............... 357/4, 16, 22, 23.2

[56] References Cited

U.S. PATENT DOCUMENTS 4,835,583  5/1989  Morioka et al. ................ 357/4

OTHER PUBLICATIONS

Applied Physics Letters, vol. 45, #11, pp. 1227-1229 by Dawson et al. Dec. 1984.
Journal of Vac. Sci. Technol. B, vol. 2, #2, pp. 265-268 by Schaff et al. Apr. 1984.

*Primary Examiner*—Mark Prenty
*Attorney, Agent, or Firm*—Stuart T. Langley

[57] ABSTRACT

A heterojunction field effect transistor (HFET) having a source, drain, and channel, wherein the channel is a top layer of a superlattice buffer, eliminating the need for a thick buffer layer. The superlattice buffer comprises alternating barrier and quantum well layers which are thin enough to provide wide separation in energy bands within the quantum wells. In a preferred embodiment the channel comprises a quantum well and one to five monolayers having a different bandgap than the channel region and serves to modify electron wave function and conduction band energy in the channel region. Preferably, a ten period AlAs/GaAs superlattice is formed underneath the channel.

14 Claims, 1 Drawing Sheet

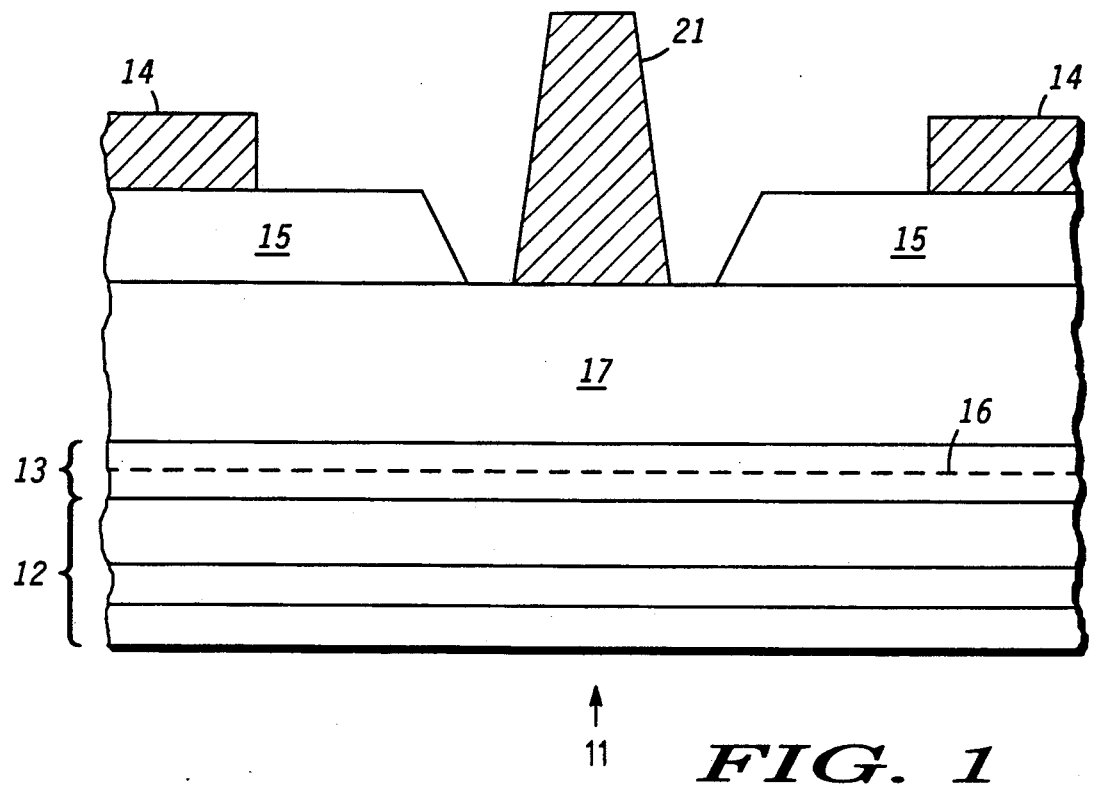
FIG. 1
FIG. 2
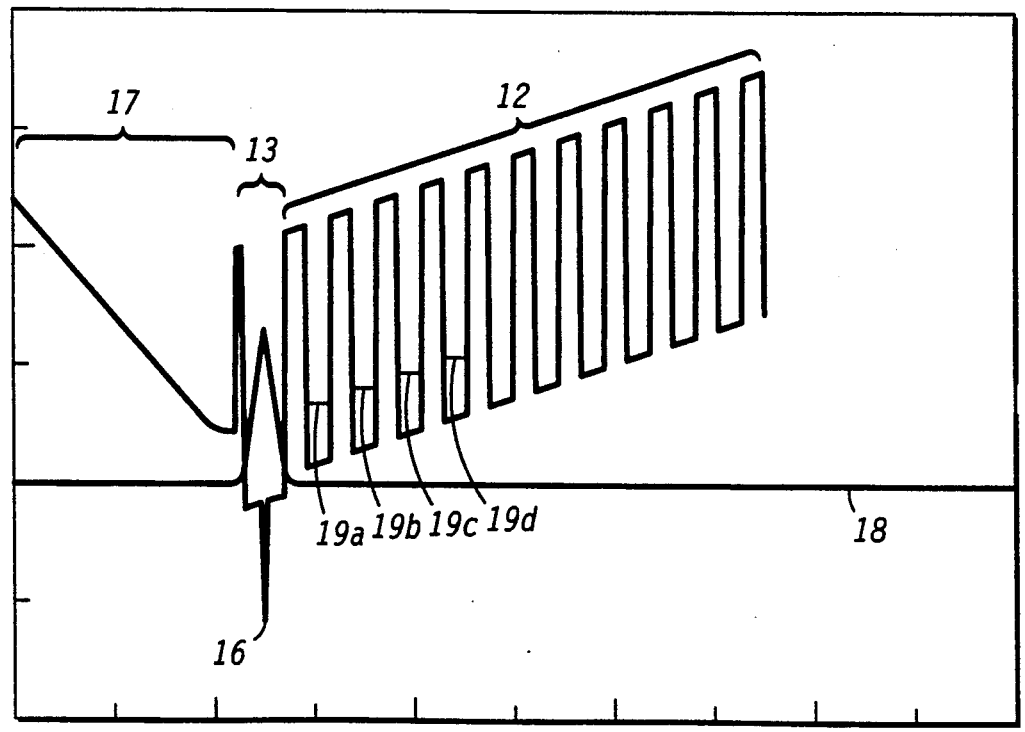

SUPERLATTICE FIELD EFFECT TRANSISTOR WITH MONOLAYER CONFINEMENT

BACKGROUND OF THE INVENTION

The present invention relates, in general, to heterojunction field effect transistors, and more particularly, to heterojunction field effect transistors having a superlattice buffer layer underneath a channel layer.

Field effect transistors operate by controlling current flow through a channel region with a gate electrode. To maintain current control it is necessary to confine charge carriers within the channel region. In metal oxide semiconductor FET (MOSFET) technology current confinement is accomplished by separating the channel region from the gate electrode by an insulating oxide region. In heterojunction FET (HFET) technology, however, the insulating region is not used and carrier confinement is achieved by a heterojunction barrier layer between the gate electrode and the channel region. In other words, the channel is formed by a quantum well using a material with a narrower bandgap than the barrier layer. A similar heterobarrier may be used below the channel region to keep charge carriers from straying into the substrate or buffer layer on which the channel region is formed. In HFET devices, the ability to confine charge carriers within the channel region is of great importance and directly affects device parameters such as pinch-off voltage and gate leakage.

The degree of confinement is determined by a difference in energy between a ground state in the channel region and a ground state of an adjacent layer. Typically, a gallium arsenide (GaAs) buffer layer underneath the channel region provided a gradual energy difference arising from the difference in doping levels of the channel and buffer layer, and thus poor charge confinement. Even when indium gallium arsenide (InGaAs) is used for the channel region, the difference in energy between the back side of the channel and the GaAs buffer is only about 0.1 eV. To compensate for this low energy difference, channel regions had to be made quite thick. Thick channel regions lower the ground state energy in the channel region improving confinement at the expense of increased epitaxial growth time and lower charge carrier concentration and transconductance. Further improvement is desirable.

The barrier used below the channel region serves two primary functions. In addition to confining carriers within the channel region, the barrier is also a mechanical buffer between a semi-insulating substrate and the channel region. The substrate usually has a high defect density, and the buffer layer functions, at least in part, to prevent substrate defects from propagating upwards to the channel region. Recently, superlattice structures have been used to replace a portion of the thick GaAs buffer layer. Superlattice structures stop defect propagation better than single material layers of comparable thickness. The superlattice structure was relied on for its mechanical properties and little attention was directed towards using solid state electronic properties of the superlattice. Even when superlattice layers were used, however, thick GaAs buffer layers were formed between the superlattice and the channel layer. Until now, the superlattice structure was separated from the channel by a GaAs buffer so the solid state properties were believed to be unimportant.

To conduct current through the channel region, charge carriers, holes for a P-channel device and electrons for an N-channel device must be provided in the channel region. Higher charge carrier concentration in the channel region results in higher transconductance and lower channel resistance in the HFET device. HFETs are usually modulation doped by placing a thin, heavily doped layer called a carrier supply layer in the barrier layer so that excess charge carriers tunnel from the carrier supply layer through, or thermionically transported over the top of the barrier layer to the quantum well channel region. Charge carriers are then trapped in the quantum well.

When the substrate is biased, a gradual energy gradient is produced in the conduction band of a GaAs buffer layer. This gradual slope in the conduction band provided a continuum of states in which energetic charge carriers in the channel could escape the channel by moving into the buffer layer. As the charge carriers gained more energy, they escaped as far as possible into the buffer layer. Of course, the farther into the buffer layer the charge carriers penetrated, the less control could be exercised on them by the gate electrode. To enhance carrier confinement and improve gate control, it is desirable to have a large energy discontinuity rather than a gradual slope in the conduction band.

Accordingly, it is an object of the present invention to provide a heterojunction field effect transistor having improved transconductance.

A further object of the present invention is to provide a heterojunction field effect transistor having a comparatively thin superlattice layers formed directly underneath the channel region.

A further object of the present invention is to provide a heterojunction field effect transistor having a quantized energy gradient between the channel region and an underlying substrate.

Another object of the present invention is to provide an HFET device having improved pinch off voltage.

Still another object of the present invention is to provide an HFET structure with a short epitaxial growth time.

A further object of the present invention is to provide an HFET device having improved charge carrier confinement within the channel region.

SUMMARY OF THE INVENTION

These and other objects and advantages of the present invention are achieved by a heterojunction field effect transistor (HFET) having a source, drain, and channel, wherein the channel is a top layer of a superlattice buffer, eliminating the need for a thick buffer layer. The superlattice buffer comprises alternating barrier and quantum well layers which are thin enough to provide wide separation in energy bands within the quantum wells.

In a preferred embodiment the channel comprises a quantum well and at least one micro-quantum well. The micro-quantum well comprises one to five monolayers having a different bandgap than the channel region and serves to modify electron wave function and conduction band energy in the channel region. Preferably, an indium arsenide monolayer is used as a micro quantum well in an InGaAs channel region and functions to move a first quantized energy level $E_0$ closer to the bottom of the channel region quantum well thereby increasing electron concentration by increasing effective band offset potential.

BRIEF DESCRIPTION OF THE DRAWINGS

FIG. 1 illustrates a highly simplified cross-sectional view of a heterojunction field effect transistor embodying the present invention; and FIG. 2 illustrate computer model of a band diagram for a preferred embodiment in accordance with the present invention.

DETAILED DESCRIPTION OF THE DRAWINGS

FIG. 1 illustrates a highly simplified view of a heterojunction field effect transistor (HFET) structure of the present invention. Although illustrative of the modified channel region and superlattice buffer in accordance with present invention, the device structure shown in FIG. 1 does not include many structures and features which may be present in a practical HFET device. These modifications and additions to the structure shown in FIG. 1 which would yield a practical and manufacturable HFET device are well known in the semiconductor art and are intended to be encompassed within the scope of the present invention.

Although described in terms of an N-channel FET formed using gallium arsenide base compounds, it should be understood that the structure of FIG. 1 could be formed as a P-channel using the method of the present invention and that materials other than gallium arsenide, such as silicon and germanium, could be used to form the heterostructure field effect transistor. In particular, the superlattice buffer underneath the channel may comprise a wide variety of materials known in the semiconductor art, subject to the thickness and energy limitations set out hereinafter. Of primary importance when applying the present invention to other material types is maintaining band gap relationships between various layers and regions within the HFET device rather than particular material choice or doping concentrations which may be optimized for a particular application.

As used hereinafter, the term "micro quantum well" refers to a layer which is on to five atomic layers thick. Usually it is preferable that a micro quantum well comprise a single atomic layer, or monolayer, but acceptable results are achieved with multiple monolayers. Micro quantum well layers, as well as other layers used in the structure of the present invention, can be formed using conventional epitaxial deposition techniques such as metal organic vapor phase epitaxy (MOVPE), molecular beam epitaxy (MBE) or atomic layer epitaxy (ALE), or the like.

The HFET structure of FIG. 1 is formed on a semi-insulating substrate 11 on which is formed a superlattice buffer 12. Superlattice buffer 12 usually comprises layers of material such as gallium arsenide (GaAs) alternating with layers of aluminum arsenide (AlAs). Detail of superlattice buffer 12 is described hereinafter. Channel region 13, comprising GaAs or indium gallium arsenide (InGaAs), is formed covering buffer layer 12. When superlattice buffer 12 comprises GaAs/AlAs and channel region 13 comprises GaAs, channel region 13 can be thought of as the top most layer of superlattice buffer 12. This characterization is helpful in distinguishing the present invention over previous methods which use a superlattice to replace only a portion of a buffer layer.

In one embodiment channel region 13 comprises $In_{0.25}Ga_{0.75}As$. Although GaAs has been used widely in the industry, InGaAs channel regions have been found to provide superior device performance. Channel region 13 is covered by a barrier region 17 comprising aluminum gallium arsenide (AlGaAs), and more specifically, $Al_{0.3}Ga_{0.7}As$. Because barrier region 17 is usually doped to provide charge carriers to channel region 13, it is sometimes called a charge supply layer. Channel region 13 forms a quantum well between buffer layer 12 and barrier region 17, and therefore may be alternately referred to as quantum well 13. Gate electrode 21 is formed in contact with a top surface of barrier region 17 and forms a Schottky barrier with barrier region 17. It is this Schottky barrier which electrically separates gate electrode 21 from channel region 13.

Source/drain electrodes 14 are formed in ohmic contact with heavily doped regions 15, comprising a material such as GaAs to which ohmic contact can readily be made. Doped portions of barrier region 17 and channel region 13 underneath regions 15 on either side of gate electrode 21 provide ohmic contact between source/drain electrodes 14 and channel region 13, although these doped portions are not indicated in FIG. 1 to ease understanding of the drawing.

Channel region 13 underneath gate electrode 21 is intentionally undoped to improve mobility of charge carriers in the channel. Doping is provided by a charge supply layer (not shown), which is a very thin, heavily doped region of AlGaAs formed during the formation of barrier region 17. The charge supply layer may also comprise indium aluminum arsenide which will also supply excess charge carriers. The charge supply layer is formed close enough to channel region 13 so that excess charge carriers in the doping supply layer can tunnel into channel region 13, while maintaining separation donors or accepters from carriers in channel region 13. Because channel region 13 is formed of a narrower bandgap material than barrier region 17, charge carriers fall into channel region 13 and are trapped due to the heterojunction barrier formed between channel region 13 and barrier region 17. This technique is known as modulation doping and allows charge carriers to be supplied to channel region 13 without actually doping channel region 13.

In a preferred embodiment micro quantum well 16 is formed in channel region 13, illustrated by a dashed line extending horizontally through channel region 13. Micro quantum well 16 comprises a material having a smaller bandgap than channel region 13 such a indium arsenide (InAs) when InGaAs is used for channel region 13. Micro quantum well 16 modifies solid state characteristics of channel region 13 thereby affecting device performance, as described in copending patent application Ser. No. 07/578,167 by some of the inventors of the present invention and assigned to the same assignee as the present invention, and incorporated herein by reference. Narrow bandgap micro quantum well 16 may be used alone or in conjunction with one or more wide bandgap monolayers as described in copending patent application Ser. No. 07/578,167.

Superlattice buffer 12 comprises layers of wide bandgap material alternating with layers of narrow band gap material. An example is layers of AlAs alternating with layers of GaAs. Unlike previous buffer layers having superlattice structures, the present invention replaces the entire buffer layer with a superlattice structure, completely eliminating any thick GaAs buffer layer. Channel layer 13 is formed directly on top of superlattice buffer 12, and may actually be considered a part of superlattice buffer 12.

An important feature of the present invention is that thickness of layers which make up superlattice buffer 12 is carefully designed to provide significant energy level separation in each of the narrow band gap layers in superlattice buffer 12. The narrow bandgap layers form quantum wells sandwiched between large bandgap barrier layers. As the narrow bandgap layers are made thinner, separation between energy levels within the quantum wells increases. Characteristically, each of the narrow bandgap layers of the present invention is much thinner than previous superlattice structures which were relied on primarily for mechanical properties. In one experimental structure using AlAs/GaAs, both the quantum well layers and the wide bandgap layers were approximately twenty five angstroms thick. In another experimental structure also using AlAs/GaAs the quantum well layers were approximately forty two and one half angstroms thick while the wide band gap layers are eight and one half angstroms thick.

FIG. 2 illustrates a conduction band diagram of one embodiment of the present invention under bias. Distance from gate electrode 21, shown in FIG. 1, is illustrated on a horizontal axis in FIG. 2. Relative conduction band energy is illustrated on a vertical axis in FIG. 2. This embodiment comprises a ten period AlAs/GaAs superlattice buffer 12, where each layer of the superlattice is approximately 20-25 angstroms thick. As described hereinbefore, superlattice buffer 12 may comprise other materials such as indium phosphide/indium aluminum arsenide or aluminum antimonide. It is important that superlattice buffer 12 comprise compatible crystalline structures with film thickness less than critical thickness for generation of misfit dislocations. Channel region 13 comprises a layer of InGaAs formed on top of the superlattice layer farthest from substrate 11 shown in FIG. 1. Micro quantum well 16 comprises InAs, but may comprise any material with a narrower bandgap than channel region 13. Barrier layer 17, as shown in FIG. 1, separates channel region 13 from a surface on which gate electrode 21 is formed.

Superimposed on the conduction band diagram is a charge carrier concentration curve 18. As shown in FIG. 2, the structure is biased with a substrate potential which causes the conduction band of superlattice buffer 12 to gradually slope upwards moving away from channel region 13 towards the semi-insulating substrate (not shown). FIG. 2 represents the conduction band when a gate bias is applied. As can be seen in FIG. 2, a high peak concentration occurs in channel region 13, which rapidly tapers off. Few charge carriers escape into the quantum well layers of superlattice buffer 12.

In the part, when a GaAs buffer was used underneath the channel region, the charge carrier concentration curve had a much lower peak concentration, and extended outward into the GaAs buffer for similar gate bias voltages. It is apparent from FIG. 2 that no substantial charge escapes from channel region 13.

It is believed that one reason improved charge confinement is provided is that the potential barrier provided by superlattice buffer 12 is quantized rather than continuous. Because each quantum well in superlattice buffer 12 is thin, energy levels within those quantum wells are widely separated. Each quantum well has a ground state illustrated by lines 19a-19e. Charge escaping channel 13 must overcome a potential barrier between the ground state of channel 13 (not shown) to the ground state 19a of the quantum well adjacent to channel 13. Because no intermediate energy level exists, a forbidden energy gap is created between channel 13 and the adjacent well. Similar gaps are created between each adjacent well within superlattice buffer 12.

Charge cannot escape channel 13 until it gains enough energy to jump the forbidden gap to the adjacent well. Similarly, charge cannot escape further into superlattice buffer 12 until it gains the required energy to jump the next forbidden gap. In the past, a continuous GaAs buffer provided a continuous potential gradient between channel 13 and substrate 11, allowing charge to escape as far as possible into the GaAs buffer. Previous structures used only mechanical defect blocking properties of a superlattice, and so it was desirable to increase the number of periods of the superlattice. In contrast, it is desirable in the present invention to reduce the number of periods in order to increase the energy gap between adjacent wells in superlattice buffer 12 while maintaining the mechanical defect blocking property.

The preferred embodiment illustrated in FIG. 2 is only one means contemplated to achieve the benefits and advantages of the present invention. Another, simpler structure uses a GaAs channel without micro quantum well 16. The GaAs channel is actually the final layer of superlattice buffer 12, and is therefore much thinner than previous GaAs channel regions used in HFETs. The GaAs channel provides less confinement than an InGaAs channel. It has been found that using the superlattice buffer 12 of the present invention, devices with superior characteristics can be made even with a thin GaAs channel. In this embodiment, however, peak charge concentration would be lower and some charge spreads out into the first two to four quantum wells in superlattice buffer 12 under gate bias.

Other embodiments include using an InGaAs channel 13 without micro quantum well 16, or using a GaAs channel with micro quantum well 16. It should be understood that insertion of micro quantum well 16 dramatically improves carrier confinement in channel region 13 by reducing parasitic carriers in the supply layer and superlattice buffer 12. Further, micro quantum well 16 substantially increases the quantity of carrier inside channel region 13. This latter effect is largely responsible for enabling use of only superlattice buffer 12 as a buffer. In other words, while functional devices can be manufactured without micro quantum well 16, practical devices will almost always include micro quantum well 16.

It should be apparent that the advantages of the present invention can be achieved with a wide variety of material so long as care is taken to maintain bandgap relationships exemplified in the embodiments described in detail in this specification. For example, gallium antimonide may be used for channel region 13 in combination with indium antimonide for micro quantum well 16 and aluminum antimonide for charge supply layer 17 and barriers within superlattice buffer 12. Another example uses a germanium silicon channel region 13 with a germanium micro quantum well 16. The preferred embodiments used a ten period superlattice buffer 12, but a lower period superlattice results in wider separation of ground states and further improvement in device characteristics. A lower limit on the number of periods is controlled by the mechanical defect blocking properties of the superlattice, and the quality of semi-insulating substrate 11. Also, thinner quantum wells may be desirable in superlattice buffer 12 as state of the art improves in epitaxial deposition techniques.

By now it should be appreciated that an improved heterojunction field effect transistor device is provided with a superlattice buffer formed underneath a channel region. The superlattice buffer improves charge carrier confinement within the channel region. Improved carrier concentration and confinement results in lower gate leakage, improved speed, reduced channel resistance, and more linear pinch-off characteristics. Elimination of a thick GaAs buffer layer and a thick channel layer significantly reduce processing time to epitaxially grow the structure of the present invention. The present invention is process compatible with conventional HFET structures and can be formed using MOCVD, MBE, or ALE epitaxy techniques which are commonly used to form HFET devices. The HFET structure of the present invention improves device performance while greatly reducing process time and cost.

We claim:

1. A heterojunction field effect transistor (HFET) comprising: a semi-insulating substrate; a superlattice formed on the semi-insulating substrate, wherein a superlattice layer farthest from the substrate serves as a channel layer; a charge supply layer formed over the channel layer; a pair of source/drain regions coupled to the channel layer; and a gate electrode formed on the charge supply layer so that a voltage applied to the gate electrode controls charge in the channel layer.

2. The HFET of claim 1 wherein the channel layer comprises gallium arsenide (GaAs).

3. The HFET of claim 1 wherein the channel layer comprises indium gallium arsenide (InGaAs).

4. The HFET of claim 1 further comprising a micro-quantum well formed in the channel layer wherein the micro-quantum well comprises a material with a different bandgap energy than the channel layer.

5. The HFET of claim 4 wherein the channel layer comprises gallium arsenide and the micro-quantum well comprises indium arsenide.

6. The HFET of claim 4 wherein the channel layer comprises indium gallium arsenide and the micro-quantum well comprises indium arsenide.

7. The HFET of claim 4 wherein the charge supply layer comprises aluminum antimonide, the channel layer comprises gallium antimonide and the micro-quantum well comprises indium antimonide.

8. The HFET of claim 4 wherein the channel layer comprises germanium silicon and the micro-quantum well comprises germanium.

9. The HFET of claim 1 wherein the superlattice comprises barrier layers of aluminum arsenide alternated with quantum well layers of gallium arsenide.

10. The HFET of claim 1 wherein the superlattice comprises a plurality of quantum well layers which are sized to provide a quantized potential energy gradient between the channel layer and the substrate.

11. A heterojunction field effect transistor (HFET) comprising: a semi-insulating substrate; a superlattice buffer layer covering the substrate, wherein the superlattice buffer layer comprises a plurality of quantum wells of a predetermined thickness to provide discrete energy gaps between quantized energy levels of adjacent quantum wells in the superlattice buffer; a channel layer covering the superlattice buffer layer; a semi-insulating barrier layer covering the channel layer wherein the semi-insulating barrier layer has a bandgap which is larger than the channel layer's bandgap; a gate electrode coupled to the semi-insulating barrier layer; a source electrode in ohmic contact with the channel; and a drain electrode in ohmic contact with the channel.

12. The HFET of claim 11 wherein the superlattice buffer layer comprises aluminum arsenide layers alternating with gallium arsenide layers.

13. The HFET of claim 12 wherein each of the gallium arsenide layers is approximately twenty five angstroms thick.

14. The HFET of claim 11 wherein the superlattice buffer layer comprises indium phosphide layers alternating with indium aluminum arsenide layers.

* * * * *